(12) United States Patent
Hazanchuk

(10) Patent No.: US 8,977,885 B1
(45) Date of Patent: Mar. 10, 2015

(54) PROGRAMMABLE LOGIC DEVICE DATA RATE BOOSTER FOR DIGITAL SIGNAL PROCESSING

(75) Inventor: Asher Hazanchuk, Sunnyvale, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 452 days.

(21) Appl. No.: 13/412,408

(22) Filed: Mar. 5, 2012

(51) Int. Cl.
*G06F 1/04* (2006.01)
*G06F 5/06* (2006.01)

(52) U.S. Cl.
USPC ............................ 713/600; 713/500; 713/503

(58) Field of Classification Search
CPC ....... G06F 7/57; G06F 7/575; G06F 9/30189; G06F 9/3893; G06F 15/7867; G06F 17/5054; G06F 21/79
USPC ......................................... 713/500, 503, 600
See application file for complete search history.

(56) References Cited

U.S. PATENT DOCUMENTS

| | | |
|---|---|---|
| 6,538,470 B1 | 3/2003 | Langhammer et al. |
| 7,287,051 B1 | 10/2007 | Langhammer |
| 7,467,175 B2 | 12/2008 | Simkins et al. |
| 7,483,420 B1 | 1/2009 | Esposito |
| 7,870,182 B2 | 1/2011 | Thendean et al. |
| 2004/0156308 A1* | 8/2004 | Ha et al. ........................ 370/206 |
| 2005/0144212 A1* | 6/2005 | Simkins et al. ............... 708/490 |
| 2006/0075012 A1 | 4/2006 | Minz et al. |
| 2007/0185951 A1 | 8/2007 | Lee et al. |

FOREIGN PATENT DOCUMENTS

EP          1 566 730 A1    8/2005

* cited by examiner

*Primary Examiner* — Michael J Brown

(57) ABSTRACT

A programmable logic device is provided that includes: a programmable interconnect adapted to route input signals through the device at a system clock rate; and a digital signal processor (DSP) block coupled to the interconnect, the DSP block including: a plurality of input ports; an input register coupled to the multiple input ports and adapted to sequentially register samples of the input signals from the interconnect received at the input ports at a multiple of the system clock rate; and a multiplier adapted to multiply the registered samples at the multiple of the system clock rate to produce an output signal.

19 Claims, 3 Drawing Sheets

PROGRAMMABLE LOGIC DEVICE DATA RATE BOOSTER FOR DIGITAL SIGNAL PROCESSING

TECHNICAL FIELD

The present invention relates generally to programmable logic devices, and more particularly to the high-throughput use of digital signal processing functions within programmable logic devices despite a lower-rate switching fabric.

BACKGROUND

Programmable logic devices such as field programmable gate array (FPGAs) include a plurality of logic blocks interconnected by a switching fabric. The switching fabric in an FPGA requires a high routing density so that any given logic block can be selectively coupled to other logic blocks in the device. Thus, the samples per second (sps) that can be routed through an FPGA switching fabric is relatively low compared to some ASIC digital architectures.

For example, a microprocessor has dedicated routing that can be optimized for a given application such that its system clock can be relatively fast such as multiple GHz. But because the routing in an FPGA cannot be optimized as in an ASIC but must instead provide for a programmable high routing density, the system clock for an FPGA is typically much lower such as 250 Msps (0.25 GHz).

The routing fabric limitations impact FPGA performance in that functionalities such as digital signal processing slices may have the ability to function at significantly higher clocking rates. For example, an FPGA may included multiple digital signal processing (DSP) blocks (also referred to herein a slices). Each DSP slice includes a grouping of multipliers that are often capable of much higher clocking speeds as compared to the FPGA system clock used to move date though the switching fabric. But since the DSP slices can only receive data from the switching fabric, their resources are forced to be throttled to the FPGA system clock. If the switching fabric bottleneck could be removed, the number of necessary DSP resources such as multipliers could be reduced since the remaining multipliers would operate at their faster speed capabilities. For example, if the switching fabric is limited to 250 Msps but the DSP slices' multipliers can operate at 500 Msps, the number of utilized multipliers could be reduced one-half for a given DPS-exploiting design if the multipliers were enabled to operate at their 500 Msps capability.

Accordingly, there is a need in the art for improved programmable logic devices that enable high throughput DSP slices despite the use of a lower throughput switching fabric.

SUMMARY

In one embodiment, a programmable logic device is provided that includes: a programmable interconnect adapted to route input signals through the device at a system clock rate; and a digital signal processor (DSP) block coupled to the interconnect, the DSP block including: a plurality of input ports; an input register coupled to the multiple input ports and adapted to sequentially register samples of the input signals from the interconnect received at the input ports at a multiple of the system clock rate; and a multiplier adapted to multiply the registered samples at the multiple of the system clock rate to produce an output signal.

In another embodiment, a method of processing a plurality of input signals within a first digital signal processing (DSP) block in a programmable logic device, is provided that includes: receiving the plurality of input signals at a corresponding plurality of input ports from a programmable interconnect according to a system clock rate for the programmable logic device; alternately selecting from the received input signals at the plurality of input ports to provide a selected signal at a multiple of the system clock rate; registering the selected signal at the multiple of the system clock rate to provide a plurality of registered signal samples; and sequentially multiplying the registered signal samples at the multiple system clock rate to provide first processed signals.

In another embodiment, a programmable logic device is provided that includes: a programmable interconnect configured to provide input signals according to a system clock rate; and a plurality of digital signal processor (DSP) blocks, each DSP block including internal functional blocks configurable to process the input signals at multiples of the system clock rate, wherein the DSP blocks are configurable to be arranged from a first DSP block to a last DSP block providing an output signal at the multiple system clock rate, and wherein the plurality of DSP blocks include a plurality of system-clock-rate registers configurable to alternatively register the output signal so as to transform the output signal into a plurality of system-clock-rate output signals.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention. For example, a detailed clock generator and associated clock signal paths within the embodiments are not shown in the figures because the clock structure is conventional.

Figure 1:
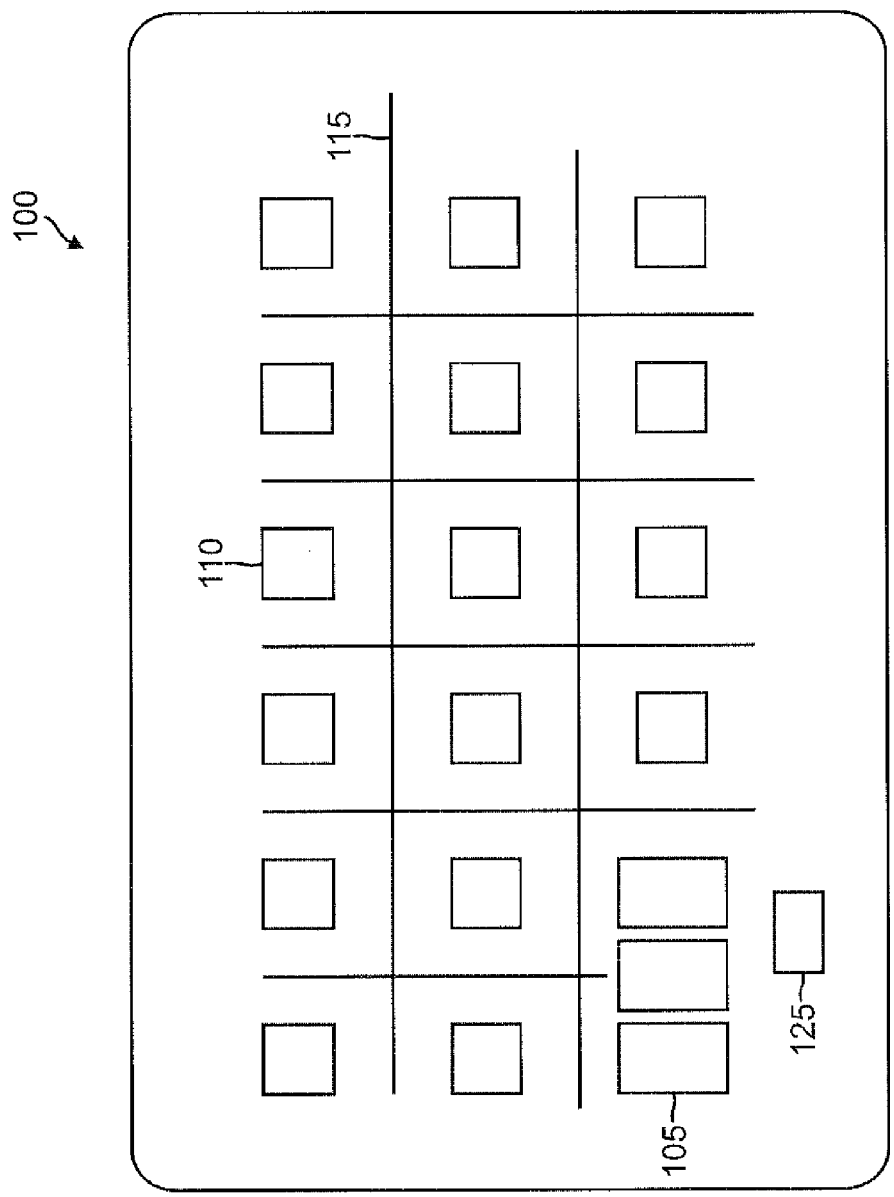
FIG. 1 is a block diagram of an FPGA including functional blocks that process data at double the clock rate as received from an interconnect in accordance with an embodiment of the invention.

Turning now to the drawings, FIG. 1 shows a programmable logic device 100 configured with double-data-rate digital-signal-processing blocks 105 that interface with a single-rate interconnect 115 in accordance with an embodiment of the disclosure. The following discussion will assume that programmable logic device 100 is a field programmable gate array (FPGA) 100 but it will be appreciated that the concepts disclosed herein are applicable to other types of programmable logic devices such as complex programmable gate arrays. As known in the art, FPGA 100 includes a plurality of logic blocks 110 that interface with a programmable interconnect 115. As discussed previously, the high routing density and general-purpose nature of interconnect 115 limits the clocking speed for FPGA 100. But the digital signal processing functionalities within functional blocks 105 have the ability to achieve considerably greater clocking rates. Thus, functional blocks 105 are configured as discussed further with regard to FIG. 2 to process data at twice the clocking rate for interconnect 115. Functional blocks 105 may thus be denoted as double-data-rate-digital-signal-processing blocks 105. Alternatively, functional blocks 105 may be denoted as digital signal processor (DSP) slices 105. FPGA 100 also includes a clock generator 125 that can generate clock signals of various rates, including a system-clock rate.

Figure 2:
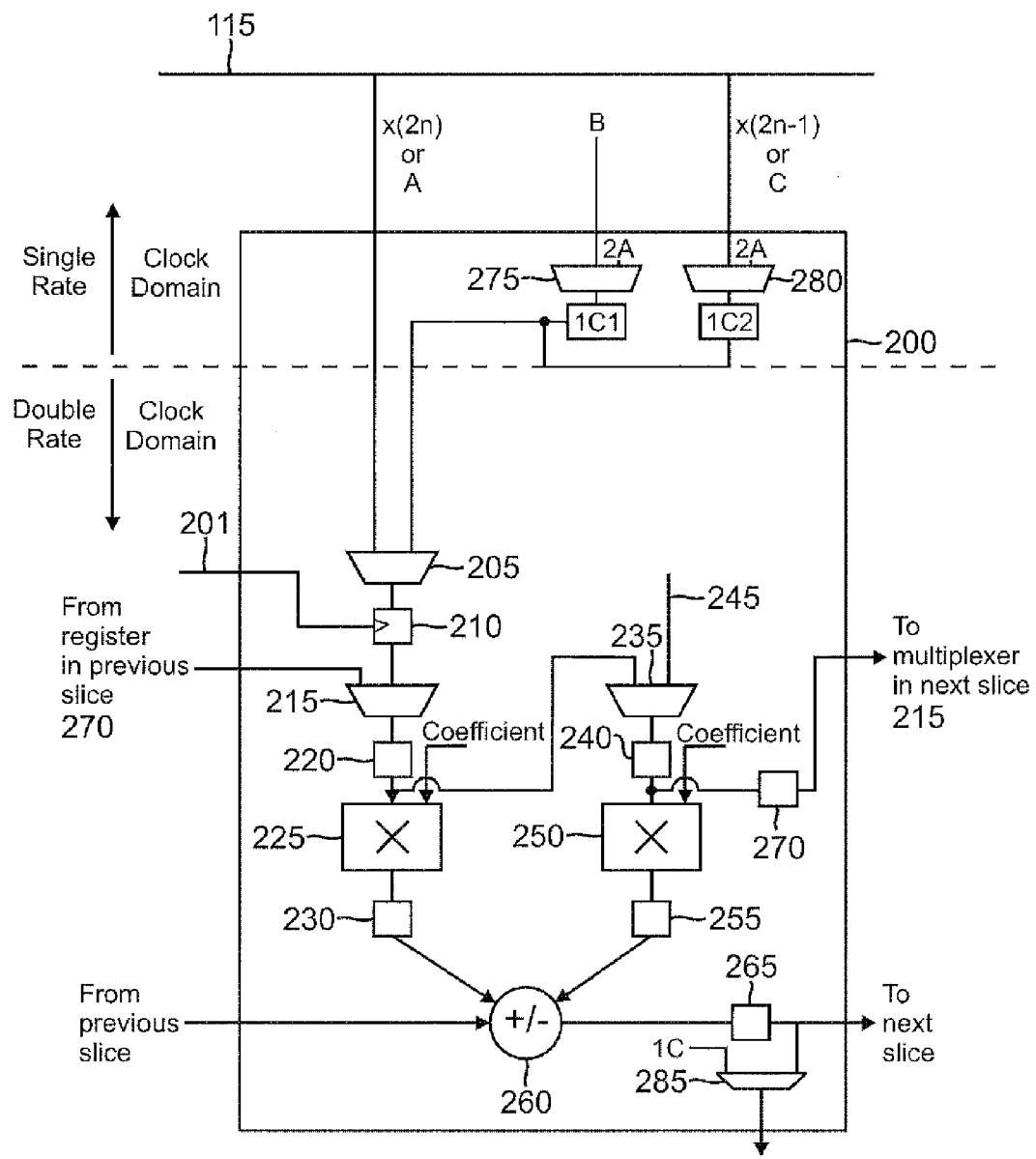
FIG. 2 is a schematic illustration of a double-rate functional block in the FPGA of FIG. 1.

FIG. 2 is a schematic diagram for a DSP slice 200. Slice 200 receives a pair of input signals $x(2n)$ and $x(2n-1)$ from programmable interconnect 115 responsive to cycles of a system clock 201. For example, the input signals may be represented in the time domain as $x(n)$ where n is the current time sample. In such an embodiment, one input signal could be the even samples for $x(n)$ as represented by $x(2n)$ whereas the remaining input signal would be the odd samples as represented by $x(2n-1)$. However, it will be appreciated that the double rate processing discussed herein may be practiced with regard to any pair of input signals. Thus, DSP slice 200 may also process generic input signals A and C in an alternative embodiment. The following discussion will assume that the input signals are even and odd time samples for an input signal $x(n)$ without loss of generality.

As discussed above, a FPGA system clock 201 is relatively slow to accommodate the generalized routing ability of interconnect 115. In contrast to this relatively slow system clock 201, a double-rate register 210 alternately registers signals $x(2n)$ and $x(2n-1)$ in response to both edges of system clock 201. A multiplexer 205 alternately selects for either of signals $x(2n)$ and $x(2n-1)$ accordingly. As used herein, the designation of "double-rate" indicates that a component is responsive to both system clock edges. Thus, in a single cycle of system clock 201 (which of course has two clock edges), multiplexer 205 selects for both of signals $x(2n)$ and $x(2n-1)$ sequentially. Since sample $x(2n-1)$ occurs before sample $x(2n)$, multiplexer 205 would first select for $x(2n-1)$ and then for $x(2n)$ in any given system clock cycle. To enable pipelining, a selected signal from multiplexer 205 is registered in double-rate register 210. Register 210 will thus sequentially register signals $x(2n-1)$ and $x(2n)$ in a single system clock cycle. In another embodiment, a separate clock running at twice or another multiple of the frequency of the system clock can be used to clock register 210. The number of input ports need not be limited to two, and register 210 would sequentially register the multiple input signals received at the multiple input ports.

A double-rate multiplexer 215 may select for the registered output signal from register 210 so that a resulting output signal from multiplexer 215 may be registered in a double-rate register 220. DSP slice 200 includes a double-rate multiplier 225 that multiplies a registered output signal from register 220 with a coefficient (in a finite impulse filter (FIR) embodiment), which is also received from programmable interconnect 115. It will be appreciated that additional registers and processing stages such as pre-adders may be added to the signal path from register 210 to multiplier 225 without departing from the double-rate techniques disclosed herein.

Should slice 200 be included in a chain of such slices, the multiplication in multiplier 225 can thus correspond to the current multiplication in a finite impulse filter (FIR). The following discussion will assume that the DSP operation is a FIR operation but it will be appreciated that other DSP operations such as a fast Fourier transform (FFT) can also be accomplished using the techniques discussed herein. If the output signal from the resulting FIR is denoted as $y(n)$, where n represents the time sample index, the output signal from the FIR can be represented as $y(n) = C_1 \cdot x(n) + C_2 \cdot x(n-1) + \ldots + C_N \cdot x(n-N)$, where $(N+1)$ represents the length of the FIR. The signals $x(2n-1)$ and $x(2n)$ are pipelined by a multiplexer 235 that selects for a registered output signal from register 220. A double-rate register 240 registers the selected output signal from multiplexer 235. Multiplexer 235 can also select for an input signal 245 to provide configurability for parallel modes. A multiplier 250 multiplies the registered output signal from register 240 with an appropriate coefficient that may also be delivered by interconnect 115.

Given this pipelining between registers 220 and 240, it is thus follows that a FIR operation may be effected. For example, suppose register 220 is registering the even sample for the input signal $x(n)$. Pipelined register 240 will thus be registering the previous odd sample for this input signal $x(n)$. In this fashion, multiplier 225 is producing the FIR tap component $C_{2n} \cdot x(2n)$ whereas multiplier 250 is providing the FIR tap component $C_{2n-1} \cdot x(2n-1)$. These output signals from multipliers 225 and 250 are registered in a register 230 and a register 255, respectively. An accumulator 260 adds the resulting FIR tap outputs so that the resulting accumulated signal may be registered in a double-rate register 265.

Each slice 200 can thus process two FIR taps per system clock cycle, thus utilizing the high-speed capabilities of the multipliers. In contrast, a prior art slice would have to operate at the slower system clock rate. A FIR may of course have more than two taps such that additional slices are chained together as follows. The registered output from register 240 is also registered in a double-rate register 270. A subsequent slice (discussed further with regard to FIG. 2) receives the registered output from register 270 at its multiplexer 215. In this fashion, the subsequent slice can process the pipelined signal from the previous slice as opposed to processing any input signals to generate the next taps in the FIR. Similarly, slice 200 itself can be configured as the subsequent two taps to a previous slice (not illustrated). In such an embodiment, multiplexer 215 in slice 200 would select for the registered output signal from register 270 in this previous slice as opposed to selecting for any input signals from interconnect 115.

Figure 3:
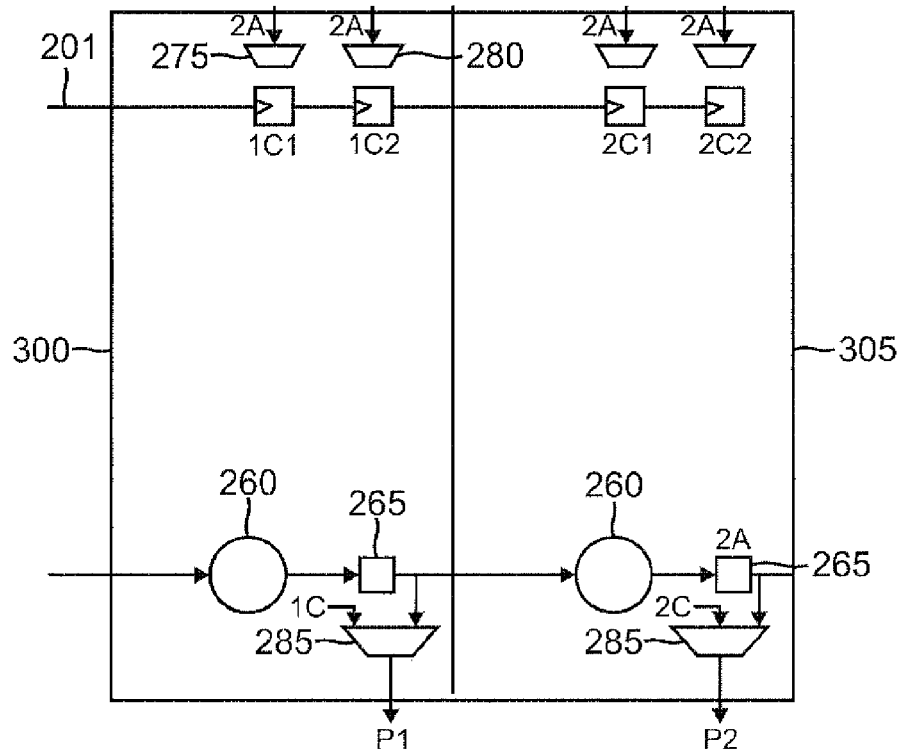
FIG. 3 is a partial schematic illustration of the final two functional blocks used in the FPGA to effect a desired signal processing function.

In this fashion, each slice in a chain of slices corresponds to two taps of the FIR. It will be appreciated, however, that the number of taps (and hence multipliers) for any given slice can be varied from two. For example, a slice could include four multipliers or some other plural number of multipliers besides two. The following discussion will thus assume without loss of generality that each slice includes the two multipliers 225 and 250. FIG. 3 shows the chaining of the two final slices in a FIR. A slice 300 is configured as the subsequent-to-last slice whereas a slice 305 is configured as the final slice in the FIR. Since FIG. 3 focuses on the demultiplexing of the FIR output from final slice 305 back to the single-edge system clock domain, non-essential components to this clock domain transition such as the multipliers are not shown for illustration clarity.

Register 265 in final slice 305 is designated as providing an output signal 2A because its role is specialized. Signal 2A is registered at the double clock rate in register 265 but interconnect 115 can only process single-rate data. The output signal 2A is thus fed back through a multiplexer 285 at the double clock rate into slices 300 and 305 in an alternating fashion. For example, at a first clock edge, signal 2A may be registered in single rate registers 1C1 and 1C2 in slice 300. At the next clock edge, signal 2A is registered in registers 2C1 and 2C2 in slice 305. Note that two registers are used in each slice because these registers can also be used in other modes to store input signals. For example, a single-rate register 1C1 associates with a multiplexer 275. Similarly a single-rate register 1C2 associates with a multiplexer 280. In a double-rate mode of operation, multiplexers 275 and 280 select for signal 2A in slice 300. But in a first slice in the FIR, multiplexer 280 would select for one of the current input samples as shown in FIG. 2. FIG. 2 shows multiplexer 275 having the capability to select for a generic input signal B, which would occur in non-double-data-rate modes of operation. The clock connections to registers such as registers 265 are not shown in FIGS. 2 and 3 for illustration clarity. However, FIG. 2 is annotated to show the single-rate and double-rate clock domains.

But the input signals have a certain word width—for example, suppose each sample x(n) discussed with regard to FIG. 2 has a width of X bits. Registers 1C1 and 1C2 thus each have this same width. Similarly, registers 2C1 and 2C2 in slice 305 would have the same width. But the multiplication in the slices doubles the width to 2×. Thus, two single-width registers are required to store the double-width output signal 2A. Registers 1C1 and 1C2 may accordingly be denoted as a single (double-width) register 1C. Similarly, registers 2C1 and 2C2 may be equivalently denoted as a single double-width register 2C. To effect the alternating storage in slices 300 and 305 at the system clock rate, register 1C is responsive to one type of clock edge whereas register 2C is responsive to the opposite clock edge. For example, register 1C may be responsive to the rising clock edge in the system clock whereas register 2C may be responsive to the falling system clock edge. In this fashion, the registration in registers 1C and 2C is staggered by a half clock cycle.

Figure 4:
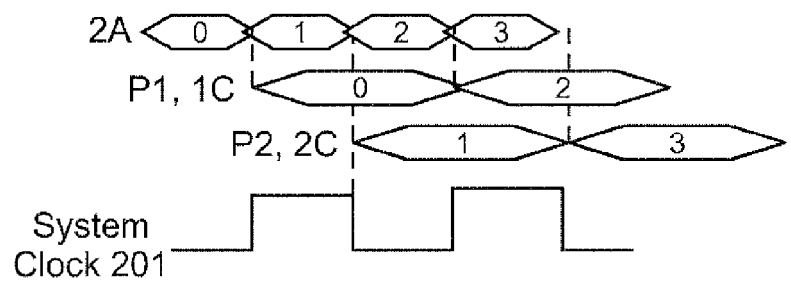
FIG. 4 is a timing diagram for the signals of the functional blocks of FIG. 3.

FIG. 4 shows a timing relationship between the output signal 2A and the registration in registers 1C and 2C with regard to cycles of system clock 201. Signal 2A includes the FIR samples designated as 0, 1, 2, and 3 at the double clock rate. At a rising edge of system clock 201, sample 0 is registered in register 1C. A Conversely, a falling edge of system clock 201, sample 1 is registered in register 2C. In this fashion, the double-rate output signal 2A is converted back to the single-rate system clock domain. Samples 2 and 3 are registered accordingly. Each slice includes a multiplexer 285 that can select for the registered output of register 265 or the registered output from the 1C/2C register. Thus, multiplexer 285 in slice 300 may select for the registered output signal from register 1C whereas multiplexer 285 in slice 305 may select for the registered output signal from register 2C. The output signal from multiplexer 285 in slice 300 is designated as P1 whereas the output signal from multiplexer 285 in slice 305 is designated as P2. Signals P1 and P2 are thus returned to interconnect 115 at the single-edge system clock domain despite the double-edge signal processing within the slices.

It will be appreciated that the techniques and concepts discussed herein are not limited to the specific disclosed embodiments. The appended claims encompass all such changes and modifications as fall within the true spirit and scope of this invention.

I claim:

1. A programmable logic device, comprising:
a programmable interconnect adapted to route input signals through the device at a system clock rate; and
a digital signal processor (DSP) block coupled to the interconnect, the DSP block including:
a plurality of input ports;
a multiplexer coupled to the plurality of input ports and adapted to alternately select among the input signals from the interconnect received at the input ports at a multiple of the system clock rate;
an input register coupled to the multiplexer and adapted to register samples of the input signals from the multiplexer at the multiple of the system clock rate; and
a multiplier adapted to multiply the registered samples at the multiple of the system clock rate to produce an output signal.

2. The programmable logic device of claim 1, wherein the output signal is clocked at the multiple of the system clock rate and the DSP block further includes:
an output register adapted to register samples of an accumulated output signal at the system clock rate; and
an output port coupled to the output register and adapted to provide the registered samples of the accumulated output signal to the interconnect at the system-clock-rate.

3. The programmable logic device of claim 2 including a plurality of DSP blocks arranged from a first DSP block to a last DSP block, the DSP blocks being configured to accumulate the output signals to produce the accumulated output signal at the last DSP block, wherein the output register of one of the DSP blocks registers a sample of the accumulated output signal in response to the rising edge of the system clock and the output register of a second of the DSP blocks registers a sample of the accumulated output signal in response to the falling edge of the system clock, the two output registers thereby sequentially registering samples of the accumulated output signal at the system clock rate.

4. The programmable logic device of claim 3, wherein each DSP block includes a plurality of multipliers.

5. The programmable logic device of claim 4, wherein each DSP block is configurable to form two taps for a FIR filter.

6. The programmable logic device of claim 3, wherein a remaining plurality of the DSP blocks are configurable to process delayed versions of the pair of input signals.

7. The programmable logic device of claim 3, wherein each DSP block includes an accumulator, and wherein the accumulators in the DSP blocks are arranged into a serial chain from the first DSP block to the last DSP block to produce the accumulated output signal.

8. A programmable logic device, comprising:
a programmable interconnect adapted to route input signals through the device at a system clock rate; and
a digital signal processor (DSP) block coupled to the interconnect, the DSP block including:
a plurality of input ports;
an input register coupled to the plurality of input ports and adapted to sequentially register samples of the input signals from the interconnect received at the input ports at a multiple of the system clock rate; and
a multiplier adapted to multiply the registered samples at the multiple of the system clock rate to produce an output signal,
wherein the input register is a double-rate register adapted to alternately register samples of the input signal received at two of the input ports at twice the system clock rate in response to both edges of a system clock.

9. A method of processing a plurality of input signals within a first digital signal processing (DSP) block within a programmable logic device, comprising:
- receiving the plurality of input signals at a corresponding plurality of input ports from a programmable interconnect according to a system clock rate for the programmable logic device;
- alternately selecting from the received input signals at the plurality of input ports to provide a selected signal at a multiple of the system clock rate;
- registering the selected signal at the multiple of the system clock rate to provide a plurality of registered signal samples; and
- sequentially multiplying the registered signal samples at the multiple system clock rate to provide first processed signals.

10. The method of claim 9, wherein sequentially multiplying the registered signal samples comprises multiplying a pair of registered signal samples at double the system clock rate to provide a pair of the first processed signals.

11. The method of claim 10, further comprising:
- delaying the selected signal to provide a delayed selected signal;
- registering the delayed selected signal at double the system clock rate to provide a pair of delayed registered signal samples;
- multiplying the delayed selected signals at double the system clock rate to provide a pair of second processed signals; and
- accumulating the first and second pairs of processed signals to provide a double-data-rate accumulated signal.

12. The method of claim 9, wherein the first DSP block is arranged with a remaining plurality of DSP blocks arranged from a second DSP block to a last DSP block, the method further comprising:
- successively delaying the delayed selected signal to provide pairs of successively delayed signals corresponding to the remaining plurality of DSP blocks such that the second DSP block corresponds to a first pair of successively delayed signals, a third DSP block corresponds to subsequent pair of successively delayed signals and so on such that the last DSP block corresponds to a last pair of successively delayed signal; and
- within each of the remaining DSP blocks: processing the corresponding pair of the delayed samples using a pair of multipliers to provide a pair of double-data-rate processed signals; accumulating each pair of double-data-rate processed signals to provide additional double-data-rate accumulated signals; and accumulating all the double-data-rate accumulated signals to provide a double-data-rate output signal.

13. The method of claim 12, wherein the last DSP block and a next-to-last DSP block each includes a system-clock-rate register configured to alternatively register the double-data-rate output signal according to opposing clock edges of the system clock.

14. The method of claim 13, wherein the last DSP block and the next-to-last DSP block each includes an output multiplexer configurable to select for a registered output signal from DSP block's system-clock-rate register to provide a system-clock-rate output signal to the programmable interconnect.

15. The method of claim 12, wherein the DSP blocks are arranged to form a FIR filter, the method further comprising processing the pair of input signals through the FIR filter to provide the double-data-rate output signal.

16. A programmable logic device, comprising:
- a programmable interconnect configured to provide input signals according to a system clock rate; and
- a plurality of digital signal processor (DSP) blocks, each DSP block including internal functional blocks configurable to alternately select the input signals at a multiple of the system clock rate, wherein the DSP blocks are configurable to be arranged from a first DSP block to a last DSP block providing an output signal at the multiple system clock rate, and wherein the plurality of DSP blocks include a plurality of system-clock-rate registers configurable to alternately register the output signal so as to transform the output signal into a plurality of system-clock-rate output signals.

17. The programmable logic device of claim 16, wherein the internal functional blocks are configurable to alternately select the input signals at double the system clock rate.

18. The programmable logic device of claim 17, wherein the internal functional blocks include a plurality of multipliers.

19. The programmable logic device of claim 18, wherein each DSP block is configurable to form two taps for a FIR filter.

* * * * *